(12) United States Patent
Yokotani

(10) Patent No.: US 10,355,430 B2
(45) Date of Patent: Jul. 16, 2019

(54) CASE CLOSING STRUCTURE

(71) Applicant: Sumitomo Wiring Systems, Ltd., Yokkaichi, Mie (JP)

(72) Inventor: Koichi Yokotani, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 15/772,987

(22) PCT Filed: Oct. 27, 2016

(86) PCT No.: PCT/JP2016/081797
§ 371 (c)(1),
(2) Date: May 2, 2018

(87) PCT Pub. No.: WO2017/086111
PCT Pub. Date: May 26, 2017

(65) Prior Publication Data
US 2018/0316142 A1 Nov. 1, 2018

(30) Foreign Application Priority Data
Nov. 17, 2015 (JP) .................... 2015-224731

(51) Int. Cl.
*H01R 13/74* (2006.01)
*B60R 16/023* (2006.01)
(Continued)

(52) U.S. Cl.
CPC ....... *H01R 13/748* (2013.01); *B60R 16/0239* (2013.01); *H01R 13/512* (2013.01);
(Continued)

(58) Field of Classification Search
CPC .................................................. H01R 13/748
(Continued)

(56) References Cited

U.S. PATENT DOCUMENTS

| 7,338,297 B2 * | 3/2008 | Maegawa | H01R 13/73 439/79 |
| 9,024,183 B2 * | 5/2015 | Sakakura | H01R 13/5202 174/50.5 |

(Continued)

FOREIGN PATENT DOCUMENTS

| JP | 2005-210881 | 8/2005 |
| JP | 2009-117306 | 5/2009 |
| JP | 2012-236450 | 12/2012 |
| JP | 2013-26078 | 2/2013 |

OTHER PUBLICATIONS

International Search Report dated Jan. 17, 2017.

*Primary Examiner* — Tulsidas C Patel
*Assistant Examiner* — Peter G Leigh
(74) *Attorney, Agent, or Firm* — Gerald E. Hespos; Michael J. Porco; Matthew T. Hespos

(57) ABSTRACT

A case closing structure (1) includes a device case (10) including a case wall (11). A shield connector (20) is mounted on the case wall (11) and has a work opening (22H) and a seal cover (40) for closing the work opening (22H). The shield connector (20) includes a mounting surface (31F) and nut holes (35H) open on the side of the mounting surface (31F). The seal cover (40) includes mounting plates (54) arranged along the mounting surface (31F) and having third bolt insertion holes (55), and shell fixing bolts (B) inserted through the third bolt insertion holes (55) and screwed into nut holes (35H). The case wall (11) includes positioning pins (13) extending perpendicular to the mounting surface (31F) and configured to restrict the rotation of the seal cover (40) with respect to the device case (10) by coming into contact with the mounting plate portions (54).

12 Claims, 4 Drawing Sheets

(51) Int. Cl.
- *H01R 13/512* (2006.01)
- *H01R 13/52* (2006.01)
- *H05K 9/00* (2006.01)
- *H02G 3/14* (2006.01)
- *H01R 13/6581* (2011.01)
- *H02G 3/08* (2006.01)

(52) U.S. Cl.
CPC ..... *H01R 13/5202* (2013.01); *H01R 13/5213* (2013.01); *H05K 9/0018* (2013.01); *H01R 13/6581* (2013.01); *H01R 2201/26* (2013.01); *H02G 3/088* (2013.01); *H02G 3/14* (2013.01)

(58) Field of Classification Search
USPC ......................................................... 439/521
See application file for complete search history.

(56) References Cited

U.S. PATENT DOCUMENTS

| | | | |
|---|---|---|---|
| 9,203,178 B2* | 12/2015 | Sakakura | H01R 13/5213 |
| 9,362,653 B2* | 6/2016 | Tanaka | H01R 13/713 |
| 9,379,481 B2* | 6/2016 | Kashiwada | H01R 13/5213 |
| 2005/0150676 A1 | 7/2005 | Higuchi et al. | |
| 2010/0255728 A1* | 10/2010 | Matsuoka | H01R 4/302 |
| | | | 439/607.55 |
| 2011/0053403 A1* | 3/2011 | Tsuruta | H01R 13/4365 |
| | | | 439/345 |
| 2011/0100704 A1* | 5/2011 | Iida | B60R 16/0239 |
| | | | 174/520 |
| 2012/0285097 A1* | 11/2012 | Sakakura | H01R 13/5213 |
| | | | 49/465 |
| 2014/0113489 A1* | 4/2014 | Tanaka | H01R 13/6592 |
| | | | 439/607.53 |

* cited by examiner

CASE CLOSING STRUCTURE

BACKGROUND

Field of the Invention

This specification relates to a case closing structure.

Description of the Related Art

Japanese Unexamined Patent Publication No. 2013-026078 discloses an electrical device installed in a vehicle and accommodated in a case. The case includes a connector mounted on an external wall for connection of the electrical device and an external device. To perform a connecting operation, the connector is provided with an opening. When the connecting operation is not performed, a seal cover is mounted on the connector to close the opening. The seal cover has a service cover to be fit to a connector and a shield shell for covering this service cover.

The shield shell includes a fastening piece having a bolt insertion hole, and the seal cover is fixed to the case by inserting a bolt through the bolt insertion hole and screwing the bolt into a screw hole provided in the case.

In the above-described configuration, the shield shell may rotate together with the bolt in tightening the bolt and the operability of an assembling operation may be reduced.

SUMMARY

A case closing structure disclosed by this specification includes a case having an opening and a seal cover configured to close the opening by being mounted on the case. The case includes a mounting surface and a screw hole open on the side of the mounting surface. The seal cover includes a mounting portion arranged along the mounting surface and having a bolt insertion hole. A bolt is inserted through the bolt insertion hole and is screwed into the screw hole. The case includes a first rotation restricting portion extending at an angle to the mounting surface and configured to restrict the rotation of the seal cover with respect to the case by coming into contact with the mounting portion.

According to this configuration, the mounting portion comes into contact with the first rotation restricting portion when tightening the bolt to restrict rotation of the seal cover. In this way, a reduction in operability during an assembling operation can be suppressed.

The case may include a case wall. A connector may be mounted on the case wall and may have the opening. The first rotation restricting portion may extend from the case wall, and the connector may include a positioning receiving portion configured to position the connector with respect to the case wall by engaging the first rotation restricting portion. According to this configuration, the first rotation restricting portion doubles as a positioning portion configured to position the connector with respect to the case wall. Thus, the case closing structure is not complicated.

The case closing structure may include a connector to be mounted on a case wall in a case having the case wall. The connector may have an opening, and a seal cover configured to close the opening by being assembled with the connector. The connector may include a mounting surface and a screw hole open on the side of the mounting surface. The seal cover may includes a mounting portion arranged along the mounting surface and having a bolt insertion hole. A bolt is inserted through the bolt insertion hole and screwed into the screw hole. A rotation restriction receiving portion is arranged at an angle to the mounting portion. The connector includes a second rotation restricting portion configured to restrict the rotation of the seal cover with respect to the connector by coming into contact with the rotation restriction receiving portion. According to this configuration, in tightening the bolt, the second rotation restricting portion contacts the rotation restriction receiving portion to restrict rotation of the seal cover. In this way, the assembling operation can be facilitated.

In the above case closing structure, the bolt may be inserted with a clearance defined between the bolt and a hole edge of the bolt insertion hole.

According to this configuration, position tolerances of the case and the seal cover can be absorbed since the bolt is inserted with the clearance defined between the bolt and the hole edge of the bolt insertion hole. However, by having this configuration, the seal cover easily rotates in tightening the bolt. In such a case closing structure, it is effective in suppressing a reduction in operability during the assembling operation to adopt a configuration for restricting the rotation of the seal cover as described above.

According to this specification, it is possible to suppress a reduction in operability of an assembling operation by suppressing the rotation of a seal cover associated with the tightening of a bolt in a case closing structure.

DETAILED DESCRIPTION

Figure 1:
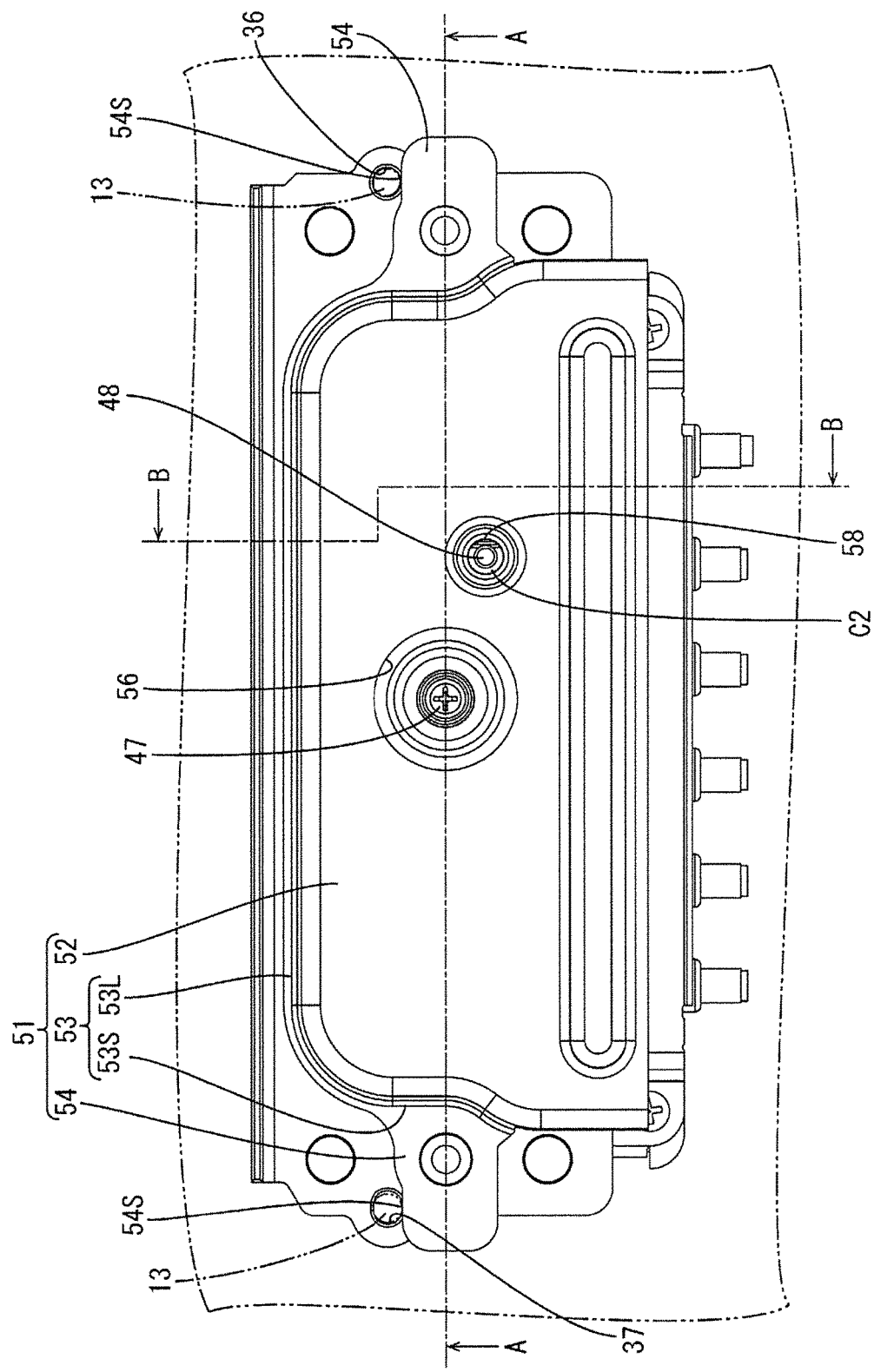
FIG. 1 is a plan view showing a device case and a seal cover mounted on this device cover in an embodiment.

An embodiment is described with reference to FIGS. 1 to 4. A case closing structure 1 of this embodiment includes a case wall 11, a device case 10 with a shield connector 20 to be mounted on the case wall 11 and a seal cover 40 to be assembled with the shield connector 20.

Device Case 10

The device case 10 is a case installed in a vehicle to accommodate a device, such as a motor or an inverter. This device case 10 is a box having an electromagnetic shielding function and includes the case wall 11 made of metal. The case wall 11 separates between an internal space and an external space, and the shield connector 20 is to be mounted on this case wall 11, as shown in FIG. 3.

Figure 3:
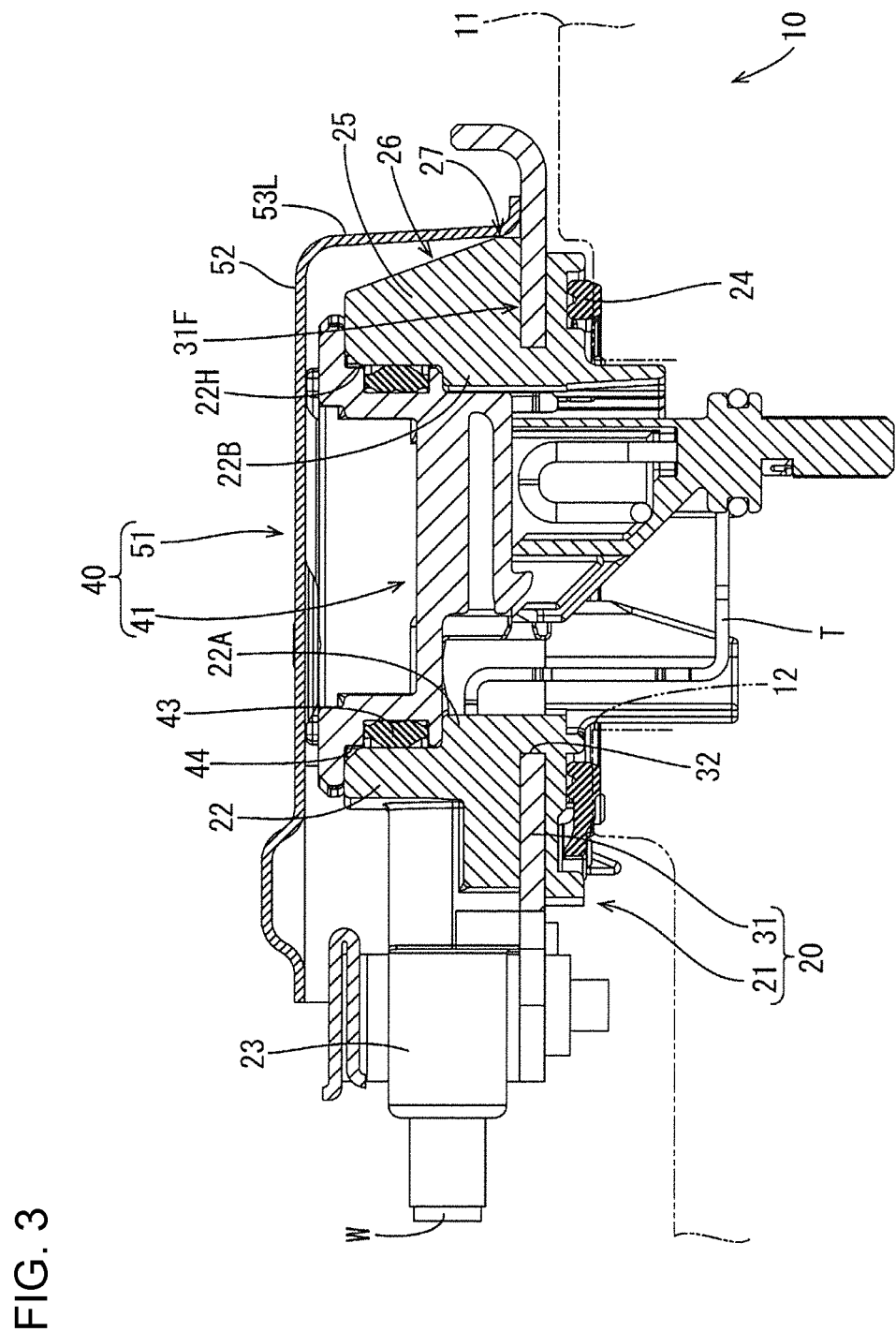
FIG. 3 is a section along B-B of FIG. 1.

As shown in FIG. 3, a connector mounting hole 12 penetrates the case wall 11 from an inwardly facing surface to an outwardly facing surface of the device case 10.

Figure 2:
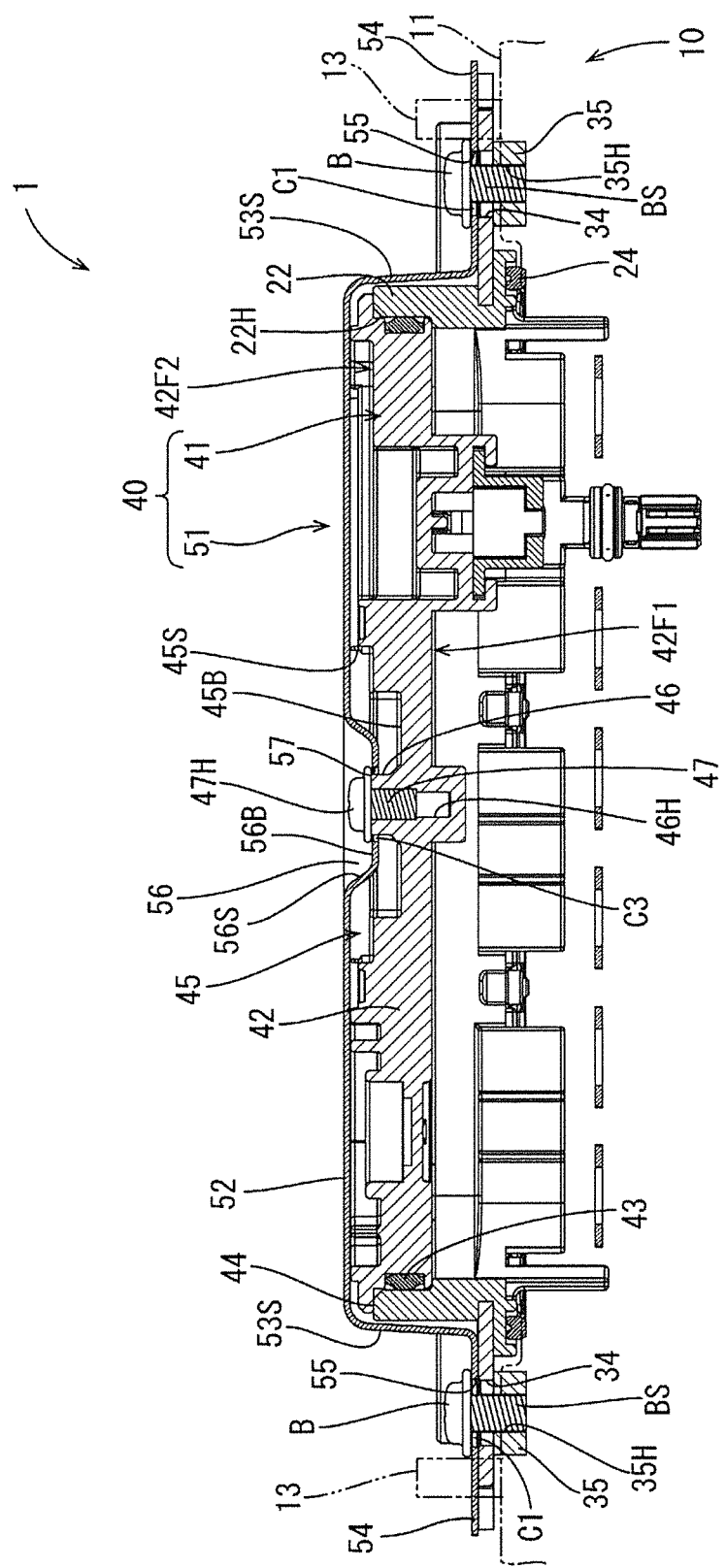
FIG. 2 is a section along A-A of FIG. 1.

The case wall 11 includes two positioning pins 13 (equivalent to a first rotation restricting portion) for positioning the shield connector 20. Each of the positioning pins 13 is a cylindrical part standing perpendicular to the case wall 11, as shown in FIG. 2. The two positioning pins 13 are arranged across the connector mounting hole 12.

Figure 4:
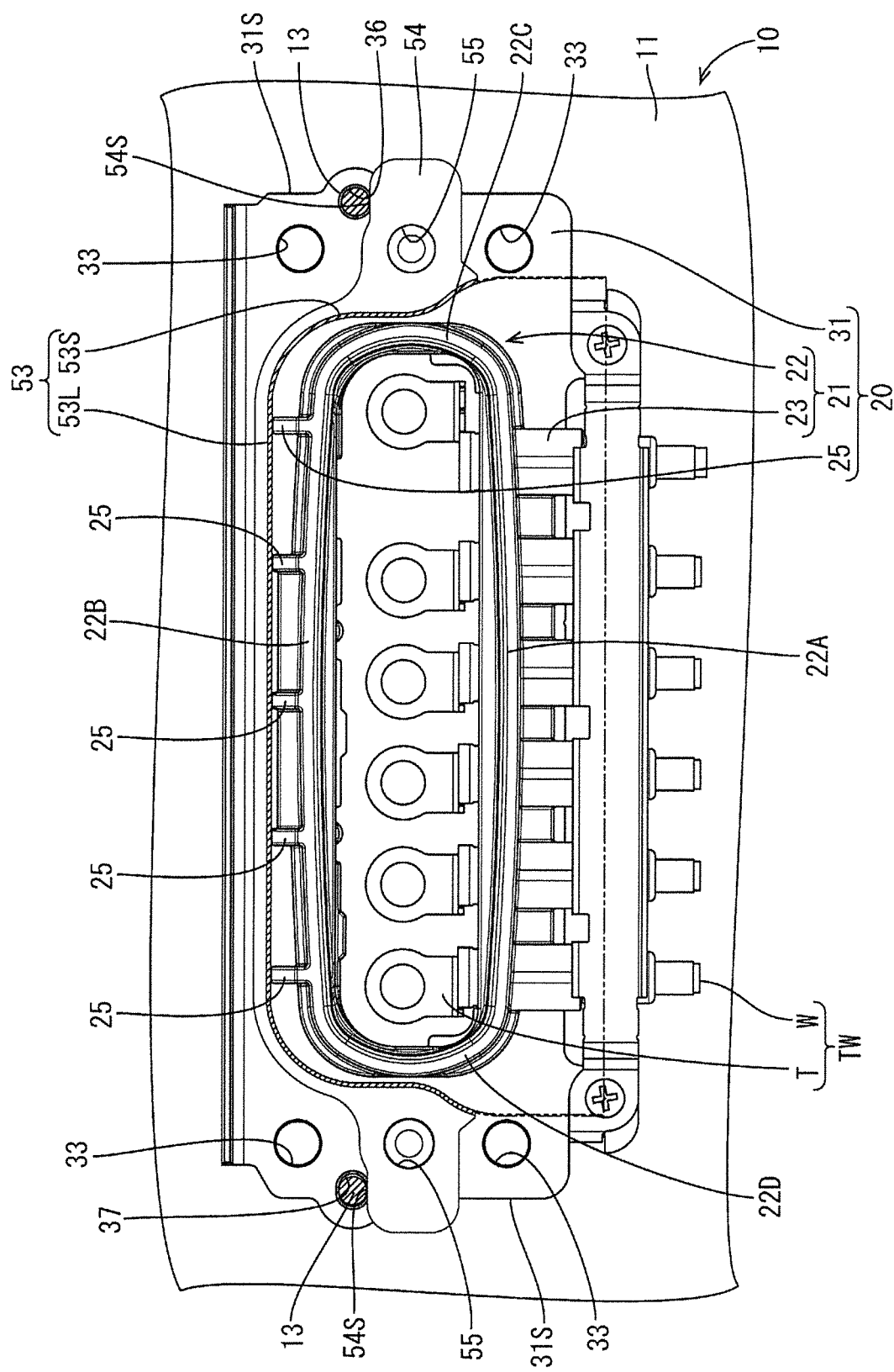
FIG. 4 is a plan view partly in section showing the seal cover mounted on the device cover in the embodiment.

As shown in FIGS. 3 and 4, the shield connector 20 includes a connector housing 21 for holding wires with terminals WT, and a fixing plate 31. Each wire with terminal WT has a general configuration of a terminal fitting T connected to an end of a wire W.

The housing 21 is made of synthetic resin and includes, as shown in FIG. 4, a receptacle 22, wire holding portions 23 and rotation preventing ribs 25 (equivalent to a second rotation restricting portion). The receptacle 22 is a rectangular tube open on both ends, as shown in FIGS. 2 and 3, and includes two substantially parallel long walls 22A, 22B and two short walls 22C, 22D connecting ends of the two long walls 22A, 22B to each other, as shown in FIG. 4.

Each of the wire holding portions 23 is a hollow cylindrical part extending out from one 22A of the two long walls 22A, 22B of the receptacle 22, as shown in FIGS. 3 and 4. An end part of the wire W and one end part of the terminal fitting T connected to this wire W are arranged inside each wire holding portion 23. The other end part of each terminal fitting T penetrates through a tubular wall of the receptacle 22 to project into the receptacle 22.

One opening of the receptacle 22 (upper opening in FIGS. 2 and 3) is a work opening 22H through which a worker inserts his hand to perform an operation when the device and the terminal fittings T accommodated inside the device case 10 are connected. When the connecting operation is not performed, this work opening 22H is closed by the seal cover 40.

Each rotation preventing rib 25 is a plate rising out perpendicular to the other long wall 22B of the receptacle 22 from this long wall 22B, as shown in FIG. 4. The rotation preventing ribs 25 are arranged in parallel at equal intervals between two short sides (sides connected to the short walls 22C, 22D) of the long wall 22B. An end surface of each rotation preventing rib 25 opposite to the long wall 22B has an inclined portion 26 continuous with an opening edge of the work opening 22H. The inclined portion 26 is inclined in a direction separating from the long wall 22B with distance from this opening edge. A butting portion 27 continuous with this inclined portion 26 is parallel to the long wall 22B, as shown in FIG. 3.

The fixing plate 31 is made of metal and is rectangular plate, as shown in FIG. 4. This fixing plate 31 includes a housing mounting hole 32, six bolt insertion holes 33, 34 and two positioning holes 36, 37.

As shown in FIG. 3, the housing mounting hole 32 penetrates from one plate surface to the other plate surface of the fixing plate 31. A part of the fixing plate 31 around the housing mounting hole 32 is embedded in the receptacle 22, and the fixing plate 31 is fixed to the housing 21 in a state where an outer peripheral edge, excluding this embedded part, projects out from the outer peripheral surface of the receptacle 22. With the shield connector 20 mounted on the case wall 11, the fixing plate 31 is arranged parallel to the case wall 11. The fixing plate 31 has a mounting surface 31F opposite to the case wall 11. The butting portion 27 of the rotation preventing rib 25 described above is adjacent to the mounting surface 31F, as shown in FIG. 3.

Three, out of the six bolt insertion holes 33, 34, are arranged side by side along a first short sides 31S of the fixing plate 31, and the remaining three are arranged side by side along a second short side 31S. The three bolt insertion holes 3, 34 arranged along the first short side 31S include two first bolt insertion holes 33 on the ends (see FIG. 4) and a second bolt insertion hole 34 in the middle (see FIG. 2). The first bolt insertion hole 33 receives a plate fixing bolt (not shown) for fixing the fixing plate 31 to the case wall 11, and the second bolt insertion hole 34 receives a shell fixing bolt B for fixing the seal cover 40 to the fixing plate 31.

A nut 35 having a nut hole 35H is fixed to a surface of the fixing plate 31 facing the case wall 11. The second bolt insertion hole 34 has an inner diameter larger than an inner diameter of the nut hole 35H and smaller than an outer diameter of the nut 35. The nut 35 is arranged concentrically with the second bolt insertion hole 34, the nut hole 35H is open toward the mounting surface 31F and a shaft portion BS of the shell fixing bolt B can be inserted through the second bolt insertion hole 34 and screwed into the nut 35.

Each of the two positioning holes 36, 37 is a hole through which each positioning pin 13 standing on the case wall 11 is inserted. One 36 of the two positioning holes 36, 37 is arranged in proximity to the one short side 31S of the fixing plate 31 and the other positioning hole 37 is arranged in proximity to the other short side 31S, as shown in FIG. 4. The one positioning hole 36 has a circular hole edge and has an inner diameter substantially equal to an outer diameter of the positioning pin 13. The other positioning hole 37 has an elliptical hole edge, an ellipse major axis is longer than the outer diameter of the positioning pin 13 and an ellipse minor axis is substantially equal to the outer diameter of the positioning pin 13.

The shield connector 20 is mounted on the case wall 11 in such an orientation that the fixing plate 31 is parallel to the case wall 11 as described above. An opening edge (opening edge opposite to the work opening 22H; lower opening edge of FIG. 2) of the receptacle 22 overlaps with a peripheral edge of the connector mounting hole 12 in an outer surface of the case wall 11. The shield connector 20 is positioned with respect to the connector mounting hole 12 by inserting the positioning pin 13 into each of the two positioning holes 36, 37. The shield connector 20 then is fixed to the case wall 11 by inserting the plate fixing bolts into the first bolt insertion holes 33 and screwing these bolts into bolt holes (not shown) arranged in the case wall 11. As shown in FIG. 2, a first sealing member 24 is disposed between the receptacle 22 and the case wall 11, and a clearance between the receptacle 22 and the case wall 11 is sealed by this first sealing member 24 being sandwiched by the receptacle 22 and the case wall 11.

With the shield connector 20 fixed to the case wall 11, each of the two positioning pins 13 projects perpendicular to the mounting surface 31F of the fixing plate 31.

Seal Cover 40

The seal cover 40 is assembled with the shield connector 20 to close the work opening 22H and includes, as shown in FIGS. 2 and 3, a cover body 41 to be fit into the receptacle 22 and a metal shield shell 51 to be assembled with this cover body 41.

The cover body 41 is made of synthetic resin and includes a fitting 42, a flange 44, a boss 46 and a restricting protrusion 48.

As shown in FIG. 2, the fitting 42 is a block-like part to be fit into the receptacle 22. A second sealing member 43 is disposed on the outer peripheral surface of the fitting 42. A clearance between the outer peripheral surface of the fitting portion 42 and the inner peripheral surface of the receptacle 22 is sealed by this second sealing member 43. The fitting 42 has a fitting surface 42F1 facing inward of the device case 10 and a shell fixing surface 42F2 facing outward of the device case 10 in a state fit in the receptacle 22.

As shown in FIGS. 2 and 3, the flange 44 projects out from the outer peripheral surface of the fitting 42, and is arranged in proximity to the shell fixing surface 42F2. With the seal cover 40 assembled with the housing 21, the flange 44 is in contact with the opening edge of the work opening 22H to position the cover body 41 with respect to the housing 21.

A shell mounting recess 45, the boss 46 and the restricting protrusion 48 arranged inside this shell mounting recess 45 are arranged on the shell fixing surface 42F2.

As shown in FIG. 2, the shell mounting recess 45 is a circular recess recessed from the shell fixing surface 42F2 and has a circular bottom surface 45B parallel to the shell fixing surface 42F2. A side surface 45S extends continuously from this bottom surface 45B to the shell fixing surface 42F2 and has a step. The shell mounting recess 45 is arranged substantially in a center of the shell fixing surface 42F2.

As shown in FIG. 2, the boss 46 is a cylindrical part extending perpendicularly from the bottom surface 45B. An open lower hole 46H is in a projecting end surface of the boss 46 for receiving a tap screw 47 for fixing the shield shell 51 to the cover body 41.

As shown in FIG. 1, the restricting protrusion 48 is a cylindrical part arranged in proximity to the boss 46 and extends perpendicularly from the shell fixing surface 42F2.

The shield shell 51 is a tray-like member formed by press-working a metal plate material. The shield shell 51 is slightly larger than the cover body 41 and is formed to cover the cover body 41 from outside. As shown in FIG. 1, this shield shell 51 includes a main plate 52, a side plate 53 (equivalent to a rotation restriction receiving portion) continuous from the main plate 52 and two mounting plates 54 continuous from the side plate 53.

The main plate 52 is rectangular, as shown in FIG. 1, is slightly larger than the shell fixing surface 42F2 and is arranged parallel to the shell fixing surface 42F2, as shown in FIG. 2. The side plate 53 extends perpendicular to the main plate 52 from a peripheral edge of the main plate portion 52 and surrounds the cover body 41 on three sides, as shown in FIG. 4. The side plate 53 includes a long side plate 53L extending from one of two long sides of the main plate 52 and two short side plates 53S respectively extending from two short sides of the main plate 52.

The mounting plates 54 extend out perpendicular from the short side plates 53S. Each mounting plate 54 is continuous from an end edge of each of the two short side plates 53S opposite to the main plate 52, as shown in FIG. 2, and projects from a middle position between the two long sides of the main plate 52.

Each mounting plate 54 includes a third bolt insertion hole 55 through which the shell fixing bolt B is inserted for fixing the seal cover 40 to the fixing plate 31. As shown in FIG. 2, the third bolt insertion hole 55 is a circular hole penetrating through the mounting plate 54 and has an inner diameter larger than an outer diameter of the shaft BS of the shell fixing bolt B.

The main plate 52 includes a screw accommodation recess 56, a boss insertion hole 57 and a restricting hole 58 arranged in the screw accommodation recess 56.

As shown in FIG. 2 the screw accommodation recess 56 is circular and is recessed in from the main plat 52 and toward the side toward which the side plate 53 extends. As shown in FIG. 2, the screw accommodation recess 56 has a bottom wall 56B parallel to the main plate 52 and a side wall 56S extending obliquely from a peripheral edge of the bottom wall 56B and continuous from the main plate 52. This screw accommodation recess 56 is located substantially at a center position of the main plate 52 between the mounting plates, 54 as shown in FIG. 1.

The boss insertion hole 57 through which the boss 46 is inserted is arranged in the screw accommodation recess 56. As shown in FIG. 2, the boss insertion hole 57 is a circular hole penetrating through the bottom wall 56B and has an inner diameter larger than an outer diameter of the boss 46 and smaller than an outer diameter of a head 47H of the tap screw 47.

The restricting hole 58 is a circular hole that penetrates through the main plate 52 and has an inner diameter larger than an outer diameter of the restricting protrusion 48 so that the restricting hole 58 can receive the restricting protrusion 48. As shown in FIG. 1, this restricting hole 58 is at a position proximate to the screw accommodation recess 56 and slightly deviated from a line connecting the two mounting plates 54 and the boss insertion hole 57.

In assembling the shield shell 51 with the cover body 41, the cover body 41 is first disposed inside the shield shell 51 while a tip part of the boss 46 is inserted through the boss insertion hole 57. At this time, if the cover body 41 is arranged in a correct orientation with respect to the shield shell 51, the restricting protrusion 48 is received into the restricting hole 58. However, if the cover body 41 is arranged in a wrong orientation with respect to the shield shell 51, the restricting protrusion 48 interferes with the main plate 51 and cannot be mounted.

Subsequently, the tap screw 47 is screwed into the lower hole 46H of the boss 46 so that the shield shell 51 is fixed to the cover body 41. At this time, an internal thread is formed in the lower hole 46H by a screw part of the tap screw 47.

The boss insertion hole 57 has the inner diameter larger than the outer diameter of the boss 46 and smaller than the outer diameter of the head 47H of the tap screw 47. Thus, the head 47H of the tap screw 47 is locked to a hole edge part of the boss insertion hole 57 while coming into contact with the projecting end surface of the boss 46 for fixing the shield shell 51 to the cover body 41. Further, the boss 46 is inserted with a clearance C3 defined between the boss 46 and a hole edge of the boss insertion hole 57. Further, the restricting hole 58 has an inner diameter larger than the outer diameter of the restricting protrusion 48 and the restricting protrusion 48 is inserted with a clearance C2 defined between the restricting protrusion 48 and a hole edge of the restricting hole 58. In this way, the shield shell 51 is held displaceably in all directions parallel to the plate surfaces of the main plate 52 and all directions perpendicular to the plate surfaces of the main plate 52 (directions along an extending direction of the boss 46) with respect to the cover body 41.

Assembling of Seal Cover 40 with Device Case 10

In assembling the seal cover 40 with the device case 10, the seal cover 40 is pressed toward the shield connector 20 and the fitting 42 is pushed into the receptacle 22. With the fitting 42 and the receptacle 22 fit, the work opening 22H is closed and the clearance between the outer peripheral surface of the fitting 42 and the inner peripheral surface of the receptacle 22 is sealed by the second sealing member 43, as shown in FIGS. 2 and 3. Further, in this state, as shown in FIG. 2, each of the two mounting plates 54 is arranged along the mounting surface 31F of the fixing plate 31, and the third bolt insertion hole 55 is arranged substantially coaxially with the second bolt insertion hole 34 and the nut hole 35H.

After the fitting of the fitting 42 and the receptacle 22 is completed, the shafts BS of the shell fixing bolts B are inserted through the second bolt insertion holes 34 and the third bolt insertion holes 55 and are screwed into the nuts 35 so that the shield shell 51 is fixed to the fixing plate 31. With the seal cover 40 assembled, the two positioning pins 13 are respectively in contact with the outer peripheral edges of the two mounting plates 54, as shown in FIGS. 1 and 4. Specifically, each mounting plate 54 has a parallel side 54S perpendicular to the short side plate 53S (parallel to the long side plate 53L) and each positioning pin 13 is in contact with this parallel side 54S. Further, as shown in FIG. 4, the butting portion 27 of each rotation preventing rib 25 is in contact with the long side plate 53L from inside.

The shield shell 51 is held displaceably with respect to the cover body 41 as described above. Thus, assembling tolerances of the shield shell 51, the cover body 41 and the receptacle 22 can be absorbed.

Further, the third bolt insertion hole 55 has the inner diameter larger than the outer diameter of the shaft BS of the shell fixing bolt B. Thus, the shaft BS is inserted with a clearance C1 defined between the shaft BS and a hole edge of the third bolt insertion hole 55. In this way, position tolerances of the nut 35 and the third bolt insertion hole 55 are absorbed. However, since the shield shell 51 is displaceable along a plate surface direction of the fixing plate 31 due to the presence of the clearance C1, the shield shell 51 may rotate about the boss 46 as the shell fixing bolt B is rotated when the shell fixing bolt B is tightened.

However, the two positioning pins 13 are respectively in contact with the outer peripheral edges of the two mounting plates 54 and the butting portions 27 of the respective rotation preventing ribs 25 are in contact with the long side plate 53L from inside to restrict the rotation of the shield shell 51.

SUMMARY

As described above, the case closing structure 1 includes the case wall 11, the device cover 10 with the shield connector 20 to be mounted on the case wall 11, and the seal cover 40 to be assembled with the shield connector 20. The shield connector 20 includes the receptacle 22 having the work opening 22H, and the seal cover 40 closes this work opening 22H. The shield connector 20 has the mounting surface 31F and the nut holes 35H open on the side of the mounting surface 31F, and the seal cover 40 includes the mounting plates 54 arranged along the mounting surface 31F and having the third bolt insertion holes 55, and the shell fixing bolts B inserted through the third bolt insertion holes 55 and screwed into the nut holes 35H. The case wall 11 includes the positioning pins 13 extending perpendicular to the mounting surface 31F and configured to restrict the rotation of the seal cover 40 with respect to the device cover 10 by coming into contact with the mounting plates 54. According to this configuration, in tightening the shell fixing bolt B, the mounting plate 54 contacts the positioning pin 13 to restrict the rotation of the seal cover 40. In this way, a reduction in operability of an assembling operation can be suppressed.

Further, the positioning pins 13 function both as a positioning portion for positioning the shield connector 20 with respect to the case wall 11 and as a rotation restricting portion for restricting the rotation of the seal cover 40. Thus, the complication of the configuration can be avoided.

Further, the seal cover 40 includes the side plate 53 arranged perpendicular to the mounting plates 54, and the shield connector 20 includes the rotation preventing ribs 25 for restricting the rotation of the seal cover 40 with respect to the shield connector 20 by coming into contact with the side plate portion 53. According to this configuration, in tightening the shell fixing bolt B, the rotation preventing ribs 25 come into contact with the side plate 53 to restrict rotation of the seal cover 40 and to facilitate the assembling operation.

In addition, the shell fixing bolt B is inserted with the clearance C1 defined between the shell fixing bolt B and the hole edge of the third bolt insertion hole 55. According to this configuration, the position tolerances of the shield connector 20 and the seal cover 40 can be absorbed since the shell fixing bolt B is inserted with the clearance C1 defined between the shell fixing bolt B and the hole edge of the third bolt insertion hole 55. However, by having this configuration, the seal cover 40 easily rotates in tightening the shell fixing bolt B. In such a case closing structure, it is effective in suppressing a reduction in operability of the assembling operation to adopt a configuration for restricting the rotation of the seal cover 40 as described above.

The invention is not limited to the above described and illustrated embodiment. For example, the following modes are also included.

Although the positioning pins 13 stand on the case wall 11 in the above embodiment, a first rotation restricting portion may stand on a fixing plate.

Although the positioning pins 13 double as the first rotation restricting portion in the above embodiment, the first rotation restricting portion may be provided separately from the positioning pins.

Although the plurality of rotation preventing ribs 25 extend from the long wall 22B of the receptacle 22 in the above embodiment, a second rotation restricting portion may extend from a short wall of a receptacle.

LIST OF REFERENCE SIGNS

1 . . . case closing structure
10 . . . device case (case)
11 . . . case wall
13 . . . positioning pin (first rotation restricting portion)
20 . . . shield connector (connector)
22 . . . receptacle
22H . . . work opening (opening)
25 . . . rotation preventing rib (second rotation restricting portion)
35F . . . mounting surface
35H . . . nut hole (screw hole)
36, 37 . . . positioning hole (positioning receiving portion)
40 . . . seal cover
53 . . . side plate (rotation restriction receiving portion)
54 . . . mounting plate (mounting portion)
55 . . . third bolt insertion hole (bolt insertion hole)
B . . . shell fixing bolt (bolt)
C1 . . . clearance

The invention claimed is:

1. A case closing structure, comprising:
   a case having a case wall with a planar mounting surface and an opening extending through the case wall from the mounting surface to an interior of the case, screw holes open in the mounting surface of the case wall and rotation restricting portions projecting from the mounting surface;
   a connector mounted to the case wall and including a connector housing projecting into the opening in the case wall and a fixing plate projecting out from the connector housing and disposed on the mounting surface of the case wall, the fixing plate including positioning holes engaged over the rotation restricting portions of the case; and
   a seal cover including a cover body mounted into engagement with the connector housing and a shield shell mounted over the cover body, the shield shell including mounting plates engaged respectively against the rotation restricting portions projecting from the mounting surface of the case wall, each of the mounting plates having a bolt insertion hole aligned respectively with one of the screw holes in the case wall.

2. The case closing structure of claim 1, further comprising:
   bolts inserted respectively through the bolt insertion holes of the shield shell and screwed respectively into the screw holes in the case wall.

3. The case closing structure of claim 2, wherein the bolt is inserted with a clearance defined between the bolt and a hole edge of the bolt insertion hole.

4. The case closing structure of claim 1, wherein the connector housing is formed from a synthetic resin and the fixing plate is formed from a metal, a part of the fixing plate being embedded in the connector housing.

5. The case closing structure of claim 1, wherein the fixing plate has a plurality of bolt insertion holes to achieve bolted connection to the case wall.

6. The case closing structure of claim 1, wherein the connector housing includes a receptacle, and the cover body of the seal cover is fit into the receptacle of the connector housing.

7. The case closing structure of claim 6, further comprising a sealing member engaged between the receptacle of the connector housing and the part of the cover body that is fit into the receptacle of the connector housing.

8. The case closing structure of claim 1, further comprising a threaded boss formed on the cover body and an opening formed in the shield shell at a position aligned with the threaded balls, a screw passing through the opening in the shield shell and engaged in the threaded boss.

9. The case closing structure of claim 1, wherein the mounting plates of the shield shell include side edges, the side edges of the mounting plates being engaged against the rotation restricting portions projecting from the mounting surface of the case wall.

10. The case closing structure of claim 1, wherein the rotation restricting portions projecting from the mounting surface of the case wall are spaced from the bolt insertion holes and the bolts engaged therein.

11. The case closing structure of claim 1 wherein the rotation restricting portions project perpendicularly from the mounting surface of the case wall.

12. The case closing structure of claim 1, wherein the connector housing includes positioning ribs configured and dimensioned to align the shield shell relative to the fixing plate.

* * * * *